United States Patent [19]
Munro et al.

[11] Patent Number: 5,506,484
[45] Date of Patent: Apr. 9, 1996

[54] DIGITAL PULSE WIDTH MODULATOR WITH INTEGRATED TEST AND CONTROL

[75] Inventors: James L. Munro, Severna Park, Md.; Geoffrey B. Lansberry, Cambridge, Mass.; Beth A. Herman, Columbia, Md.

[73] Assignee: Westinghouse Electric Corp., Pittsburgh, Pa.

[21] Appl. No.: 258,305

[22] Filed: Jun. 10, 1994

[51] Int. Cl.$^6$ ........................................ H02P 7/29
[52] U.S. Cl. ........................ 318/599; 318/139; 318/811; 388/829
[58] Field of Search ................... 318/569, 599, 318/600, 601, 603, 138, 139, 254, 439, 811; 388/804, 809, 811, 819, 829

[56] References Cited

U.S. PATENT DOCUMENTS

| | | | |
|---|---|---|---|
| 4,189,669 | 2/1980 | van Loon et al. | 318/811 |
| 4,346,434 | 8/1982 | Morinaga | 364/183 |
| 4,356,544 | 10/1982 | Ono et al. | 318/811 |
| 4,488,103 | 12/1984 | Morinaga et al. | 318/811 |
| 4,821,266 | 4/1989 | Ohm et al. | |
| 4,868,469 | 9/1989 | Chan | 318/138 |
| 5,055,762 | 10/1991 | Disser et al. | 318/811 |
| 5,309,079 | 5/1994 | Takada | 318/811 |

FOREIGN PATENT DOCUMENTS

| | | |
|---|---|---|
| 4212027 | 10/1992 | Germany. |
| 2171266 | 2/1985 | United Kingdom. |

*Primary Examiner*—Bentsu Ro

[57] ABSTRACT

A pulse width modulator (PWM) circuit for generating pulses to enable a driver control unit to drive a pair of switching circuits for an electric motor including an input section for receiving an N bit digitized input signal to be modulated and a PWM counter for continuously counting up from zero to a predetermined number and back down to zero, the PWM counter generating a digitized triangular waveform having N bits of resolution corresponding to the predetermined number. A compare unit receives and compares the digitized input signal and the digitized triangular waveform to produce an output pulse and a dead-time generator unit produces a first pulse and a second pulse from the output pulse produced from the compare unit. The first and second pulses each drives a corresponding one of the switching circuits and the first and second pulses have different transition times relative to each other. A built-in test (BIT) circuit provides BIT input signals corresponding to the first and second pulses to verify correct operation of the PWM circuit including a feed back path from the driver control unit, the driver control unit having a higher level of integration than the PWM circuit, and the BIT input signals providing individual control of each of the PWM signals.

15 Claims, 9 Drawing Sheets

DIGITAL PULSE WIDTH MODULATOR WITH INTEGRATED TEST AND CONTROL

RELATED APPLICATIONS

The following identified U.S. patent applications are filed on the same date as the instant application and are relied upon and incorporated by reference in this application.

U.S. patent application entitled "Flat Topping Concept" bearing, Ser. No. 08/258,295, and filed on the same date herewith;

U.S. patent application entitled "Electric Induction Motor And Related Method Of Cooling" bearing Ser. No. 08/258,150, and filed on the same date herewith;

U.S. patent application entitled "Automotive 12 Volt System For Electric Vehicles" bearing Ser. No. 08/258,142, and filed on the same date herewith;

U.S. patent application entitled "Direct Cooled Switching Module For Electric Vehicle Propulsion System" bearing Ser. No. 08/258,027, and filed on the same date herewith;

U.S. patent application entitled "Electric Vehicle Propulsion System" bearing Ser. No. 08/258,301, and filed on the same date herewith;

U.S. patent application entitled "Speed Control and Bootstrap Technique For High Voltage Motor Control" bearing Ser. No. 08/258,294, and filed on the same date herewith;

U.S. patent application entitled "Vector Control Board For An Electric Vehicle Propulsion System Motor Controller" bearing Ser. No. 08/258,306, and filed on the same date herewith;

U.S. patent application entitled "Control Mechanism For Electric Vehicle" bearing Ser. No. 08/258,149, and filed on the same date herewith;

U.S. patent application entitled "Improved EMI Filter Topology for Power Inverters" bearing Ser. No.08/258,153, and filed on the same date herewith;

U.S. patent application entitled "Fault Detection Circuit For Sensing Leakage Currents Between Power Source And Chassis" bearing Ser. No. 08/258,179, and filed on the same date herewith;

U.S. patent application entitled "Electric Vehicle Relay Assembly" bearing Ser. No. 08/258,117, and filed on the same date herewith;

U.S. patent application entitled "Three Phase Power Bridge Assembly" bearing Ser. No. 08/258,033, and filed on the same date herewith;

U.S. patent application entitled "Electric Vehicle Propulsion System Power Bridge With Built-In Test" bearing Ser. No. 08/258,034, and filed on the same date herewith;

U.S. patent application entitled "Method For Testing A Power Bridge For An Electric Vehicle Propulsion System" bearing Ser. No. 08/258,178, and filed on the same date herewith;

U.S. patent application entitled "Electric Vehicle Power Distribution Module" bearing Ser. No. 08/258,157, and filed on the same date herewith;

U.S. patent application entitled "Electric Vehicle Chassis Controller" bearing Ser. No. 08/258,628, and filed on the same date herewith;

U.S. patent application entitled "Electric Vehicle System Control Unit Housing" bearing Ser. No. 08/258,156, and filed on the same date herewith;

U.S. patent application entitled "Low Cost Fluid Cooled Housing For Electric Vehicle System Control Unit" bearing Ser. No. 08/258,299, and filed on the same date herewith;

U.S. patent application entitled "Electric Vehicle Coolant Pump Assembly" bearing Ser. No. 08/258,296and filed on the same date herewith;

U.S. patent application entitled "Heat Dissipating Transformer Coil" bearing Ser. No. 08/258,141, and filed on the same date herewith;

U.S. patent application entitled "Electric Vehicle Battery Charger" bearing Ser. No. 08/258,154and filed on the same date herewith.

BACKGROUND OF THE INVENTION

1. Field of the Invention

The present invention relates generally to electric vehicles. More particularly, the present invention relates to digital pulse width modulators with integrated test and control for electric vehicles. While the invention is subject to a wide range of applications, it is especially suited for use in electric vehicles that utilize batteries or a combination of batteries and other sources, e.g., a heat engine coupled to an alternator, as a source of power, and will be particularly described in that connection.

2. Discussion of Related Art

For an electric vehicle to be commercially viable, its cost and performance should be competitive with that of its gasoline-powered counterparts. Typically, the vehicle's propulsion system and battery are the main factors which contribute to the vehicle's cost and performance competitiveness.

Generally, to achieve commercial acceptance, an electric vehicle propulsion system should provide the following features: (1) vehicle performance equivalent to typical gasoline-powered propulsion systems; (2) smooth control of vehicle propulsion; (3) regenerative braking; (4) high efficiency; (5) low cost; (6) self-cooling; (7) electromagnetic interference (EMI) containment; (8) fault detection and self-protection; (9) self-test and diagnostics capability; (10) control and status interfaces with external systems; (11) safe operation and maintenance; (12) flexible battery charging capability; and (13) auxiliary 12 volt power from the main battery. In prior practice, however, electric vehicle propulsion system design consisted largely of matching a motor and controller with a set of vehicle performance goals, such that performance was often sacrificed to permit a practical motor and controller design. Further, little attention was given to the foregoing features that enhance commercial acceptance.

For example, a typical conventional electric vehicle propulsion system consisted of a DC motor, a chopper-type motor controller, an independent battery charger, and a distributed set of controls and status indicators. Vehicle performance was generally inadequate for highway driving, acceleration was uneven, and manual gear-changes were required. In addition, the issues of volume production cost, EMI, fault detection, maintenance, control and status interfaces, and safety were generally not addressed in a comprehensive manner.

There are two techniques for generating pulse width modulated (PWM) waveforms. The most common technique uses analog components while the other uses digital components. In an analog system, PWM waveforms are generated by an analog design using operational amplifiers and voltage comparators to compare crossing points of a triangular reference voltage signal with an applied control voltage waveform. The voltage comparators output the resulting PWM waveform. Then, an asynchronous dead-time circuit is used to produce a delay between the transitions of the PWM signal and the inverted PWM signal. Three sets of identical analog circuitry is required for a three phase system. However, the analog circuitry is prone to drift due to, for example, temperature variations, offsets, and gain variations that affect pulse width and cause channel-to-channel mismatches resulting in a reduction in the dynamic range of the motor control system. An implementation of a built-in test (BIT) circuitry needed to test the generation of pulse widths with nine bits of resolution is impractical. The use of digital circuitry would eliminate the disadvantages of the analog design such as drifts due to temperature variations and offsets.

Digital PWM waveform generation is available but this also has limitations. For example, in existing microcontrollers and digital processors that generate the PWM waveforms (1) a sawtooth reference waveform is used to produce the PWM signal rather than a triangular waveform, (2) a synchronous dead-time generation is not included with the processors, and/or (3) resolution is dependent on the PWM frequency and the resolution decreases as the frequency increases.

There are other stand-alone PWM integrated circuits that generate PWM waveforms, but these do not have synchronous dead-time generation, triangle based PWM generation, or individual control of the waveforms for built-in test. Also, these stand-alone PWM integrated circuits do not generate output pulses that are synchronized with the peak and/or valley of the triangular waveform.

In light of the foregoing, there is a need for an electric vehicle that has a pulse width modulator that overcomes the disadvantages of the related art.

SUMMARY OF THE INVENTION

Accordingly, the present invention is directed to a digital pulse width modulator for an electric vehicle that substantially obviates one or more of the problems due to limitations and disadvantages of the prior art.

An advantage of the present invention is the provision of an arrangement which substantially obviates one or more of the limitations and disadvantages of the described prior art.

The features and advantages of the invention will be set forth in the description which follows, and in part will be apparent from the description, or may be learned by practice of the invention. The objectives and other advantages of the invention will be realized and attained by the apparatus and method particularly pointed out in the written description and claims hereof as well as the appended drawings.

To achieve these and other advantages, and in accordance with the purpose of the invention, as embodied and broadly described, a digital pulse width modulator comprises a pulse width modulator (PWM) circuit for generating pulses to enable a driver unit to drive a pair of switching circuits for an electric motor including an input section for receiving an N bit digitized input signal to be modulated; a PWM counter for continuously counting up from zero to a number and back down to zero, the PWM counter generating a digitized triangular waveform having N bits of resolution; a compare unit for receiving and comparing the digitized input signal and the digitized triangular waveform to produce an output pulse; and a dead-time generator unit for producing a first pulse and a second pulse from the output pulse produced from the compare unit, the first and second pulses each driving a corresponding one of the switching circuits, the first and second pulses having different transition times relative to each other.

In another aspect, the pulse width modulator circuit of present invention further comprises a logic circuit for receiving the first and second pulses and enabling the driver unit in accordance with the first and second pulses, respectively; and a built-in test (BIT) circuit for providing BIT input signals corresponding to PWM signals to verify correct operation of the PWM circuit including a feed back path from the driver, the BIT input signals providing individual control of each of the PWM signals.

It is to be understood that both the foregoing general description and the following detailed description are exemplary and explanatory and are intended to provide further explanation of the invention as claimed.

The accompanying drawings are included to provide a further understanding of the invention and are incorporated in and constitute a part of this specification, illustrate one embodiment of the invention, and together with the description serve to explain the principles of the invention.

DETAILED DESCRIPTION OF THE PREFERRED EMBODIMENTS

Reference will now be made in detail to the present preferred embodiment of the invention, an example of which is illustrated in the accompanying drawings.

Figure 1:
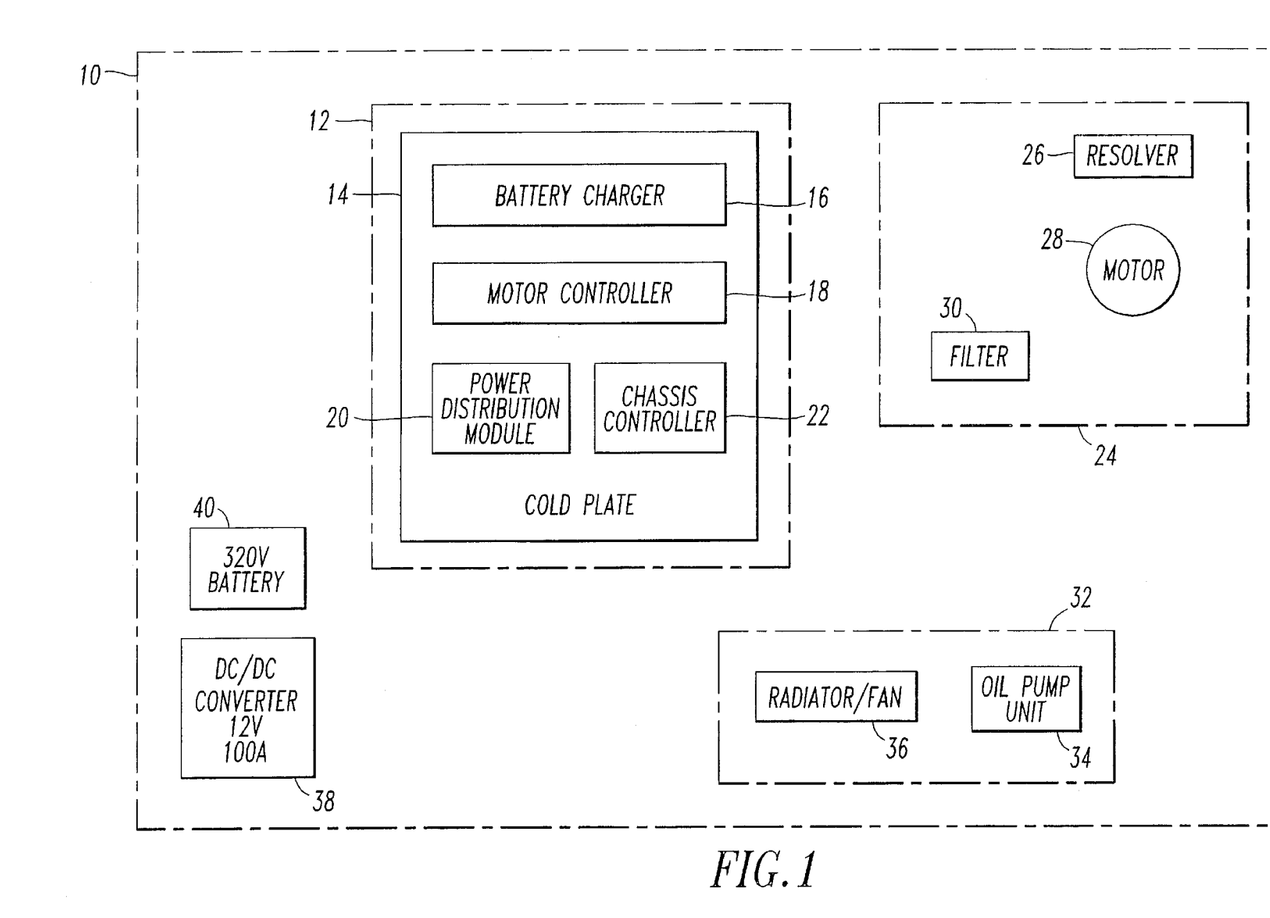
FIG. 1 is a block diagram of an electric vehicle propulsion system in accordance with a preferred embodiment of the invention.

As shown in FIG. 1, there is provided an electric vehicle propulsion system 10 comprising a system control unit 12, a motor assembly 24, a cooling system 32, a battery 40, and a DC/DC converter 38. The system control unit 12 includes a cold plate 14, a battery charger 16, a motor controller 18, a power distribution module 20, and a chassis controller 22. The motor assembly 24 includes a resolver 26, a motor 28, and a filter 30. The cooling system 32 includes an oil pump unit 34 and a radiator/fan 36.

Figure 2:
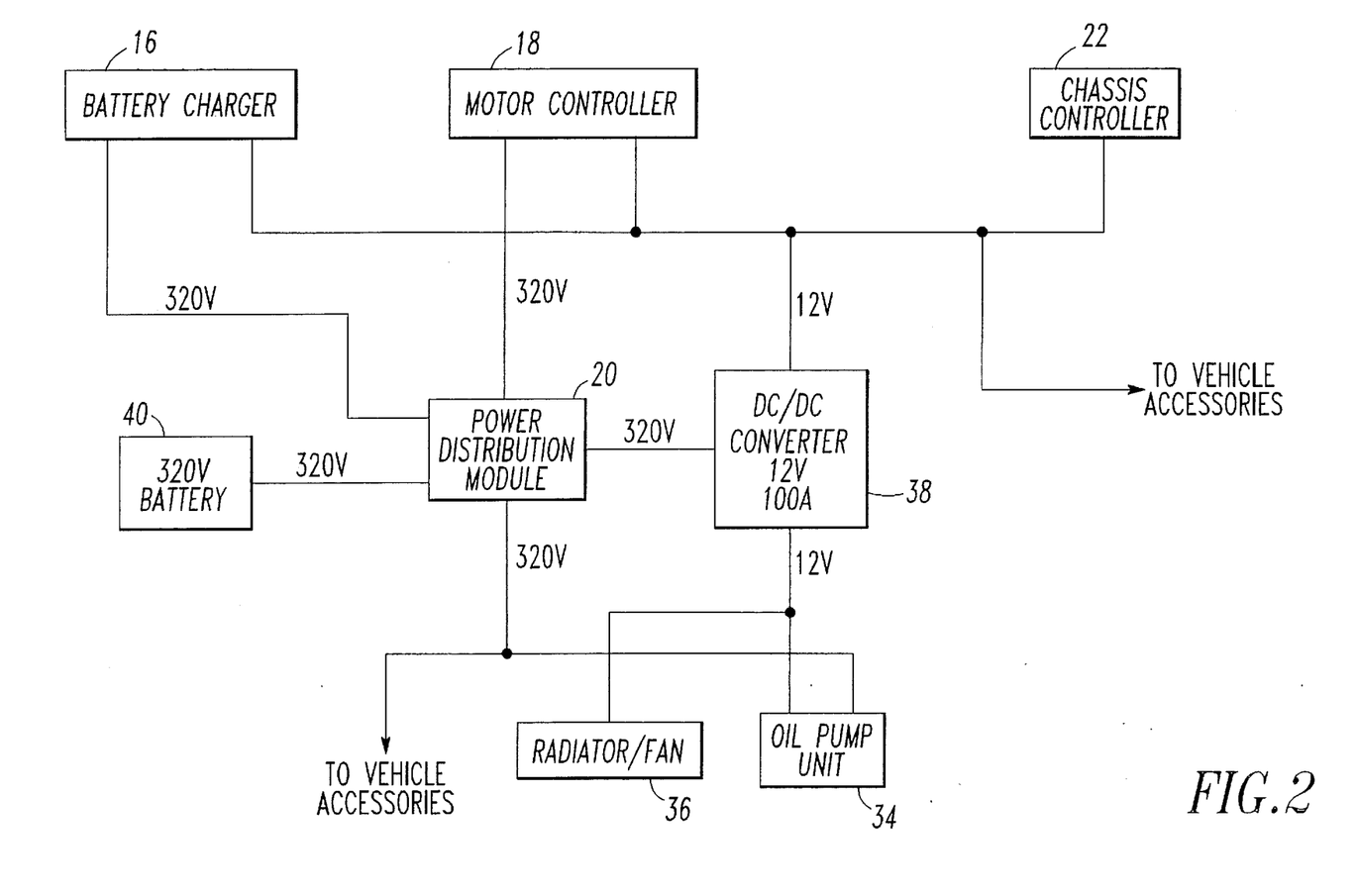
FIG. 2 is a power distribution diagram of the electric vehicle propulsion system of FIG. 1.

FIG. 2 is a power distribution diagram of the electric vehicle propulsion system 10. As shown in FIG. 2, the battery 40 serves as the primary source of power for the electric propulsion system 10. The battery 40 comprises, for example, a sealed lead acid battery, a monopolar lithium metal sulfide battery, a bipolar lithium metal sulfide battery, or the like, for providing a 320 volt output. Preferably, the electric propulsion system 10 works over a wide voltage range, e.g., 120 volts to 400 volts, to accommodate changes in the output voltage of the battery 40 due to load or depth of discharge. However, the electric vehicle propulsion system 10 is preferably optimized for nominal battery voltages of about 320 volts.

The power distribution module 20 is coupled to the output of the battery 40 and includes, among other things, fuses, wiring, and connectors for distributing the 320 volt output from the battery 40 to various components of the electric vehicle propulsion system 10. For example, the power distribution module 20 distributes the 320 volt output from the battery 40 to the motor controller 18, the DC/DC converter 38, the oil pump unit 34, and the battery charger 16. The power distribution module 20 also distributes the 320 volt output from the battery 40 to various vehicle accessories, which are external to the electric vehicle propulsion system 10. These vehicle accessories include, for example, an air conditioning system, a heating system, a power steering system, and any other accessories that may require a 320 volt power supply.

The DC/DC converter 38, which, as described above, is coupled to the 320 volt output of the power distribution module 20, converts the 320 volt output of the power distribution module 20 to 12 volts. The DC/DC converter 38 then supplies its 12 volt output as operating power to the battery charger 16, the motor controller 18, the chassis controller 22, the oil pump unit 34 and the radiator/fan 36. The DC/DC converter 38 also supplies its 12 volt output as operating power to various vehicle accessories, which are external to the electric vehicle propulsion system 10. These vehicle accessories include, for example, vehicle lighting, an audio system, and any other accessories that may require a 12 volt power supply. It should be appreciated that the DC/DC converter 38 eliminates the need for a separate 12 volt storage battery.

Figure 3:
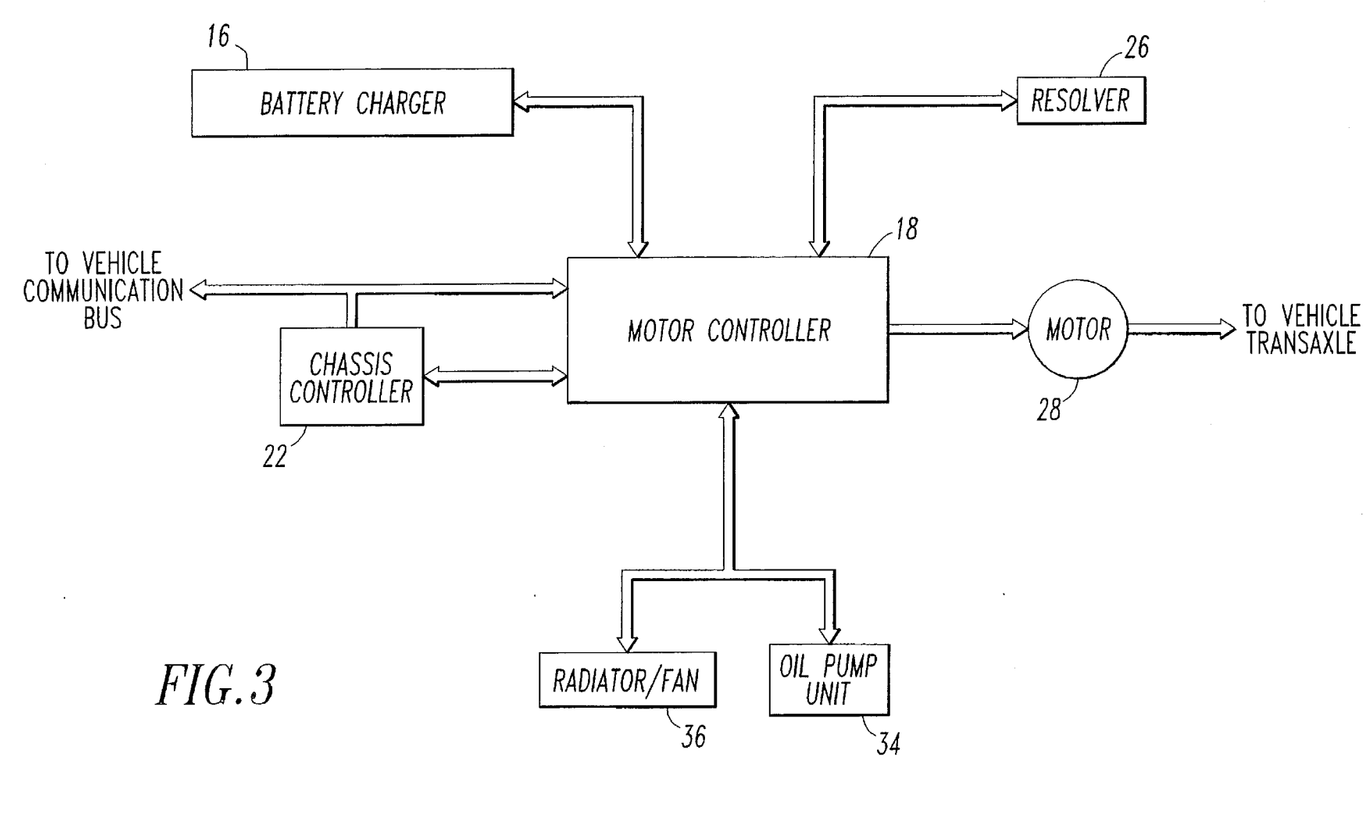
FIG. 3 is a functional diagram of the electric vehicle propulsion system of FIG. 1.
Figure 4:
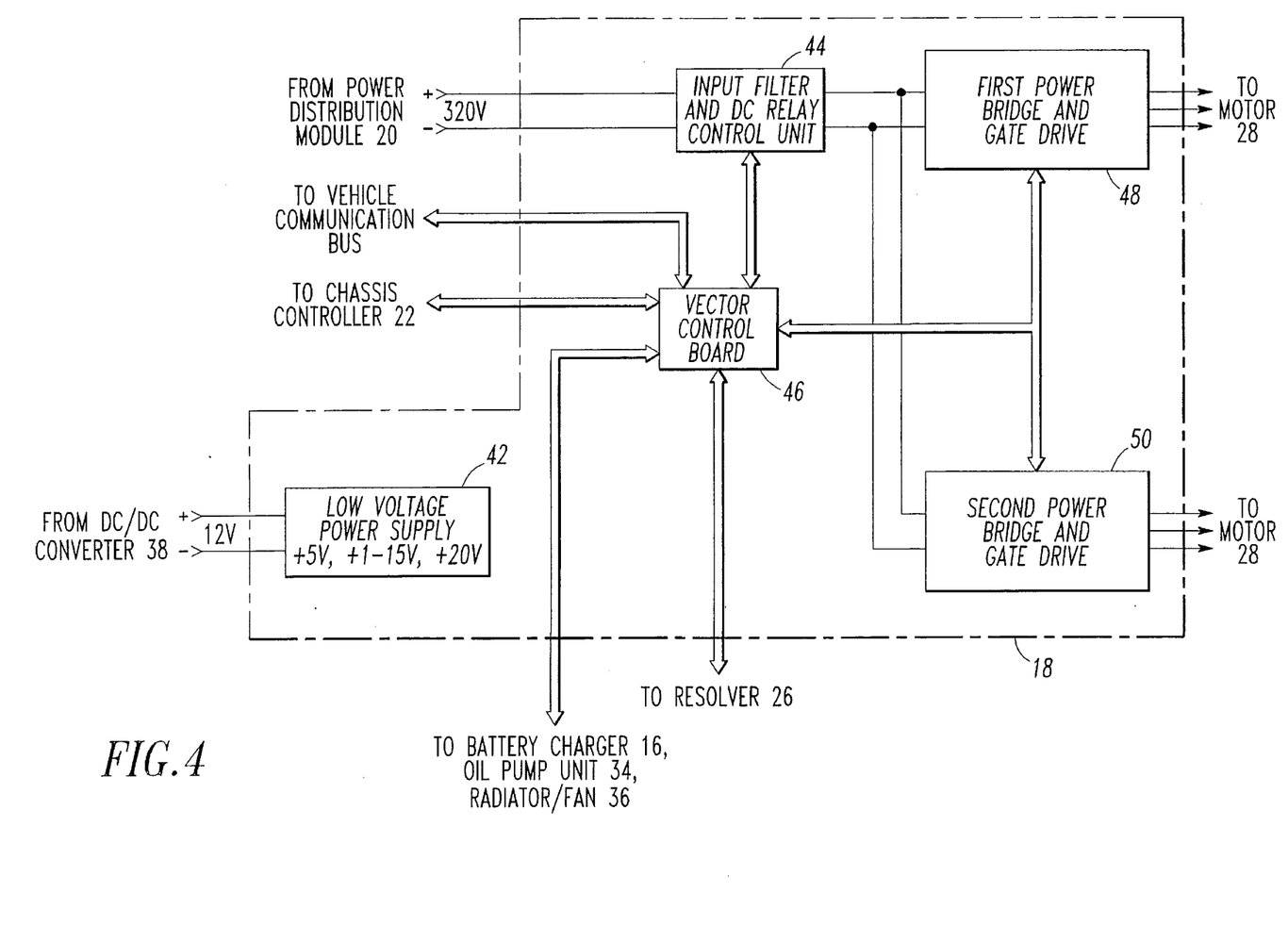
FIG. 4 is a functional diagram of the motor controller of the electric vehicle propulsion system of FIG. 1.

As shown in FIGS. 3 and 4, the components of the electric vehicle propulsion system 10 are interconnected via various data busses. The data busses can be of the electrical, optical, or electro-optical type as is known in the art. Operation of the electric vehicle propulsion system 10 will now be described with reference to FIGS. 3 and 4.

The battery charger 16 receives command signals from and sends status signals to the motor controller 18 for charging the battery 40. The battery charger 16 provides a controlled battery charging current from an external AC power source (not shown). Preferably, AC current is drawn from the external source at near-unity power factor and low harmonic distortion in compliance with expected future power quality standards. Further, the battery charger 16 is preferably designed to be compatible with standard ground fault current interrupters and single-phase power normally found at residential locations.

The oil pump unit 34 and radiator/fan 36 also receive command signals from and send status signals to the motor controller 18. As will be described in more detail below, the oil pump unit 34 and radiator/fan 36 are part of a closed loop oil cooling system for the electric vehicle propulsion system 10.

Figure 5A:
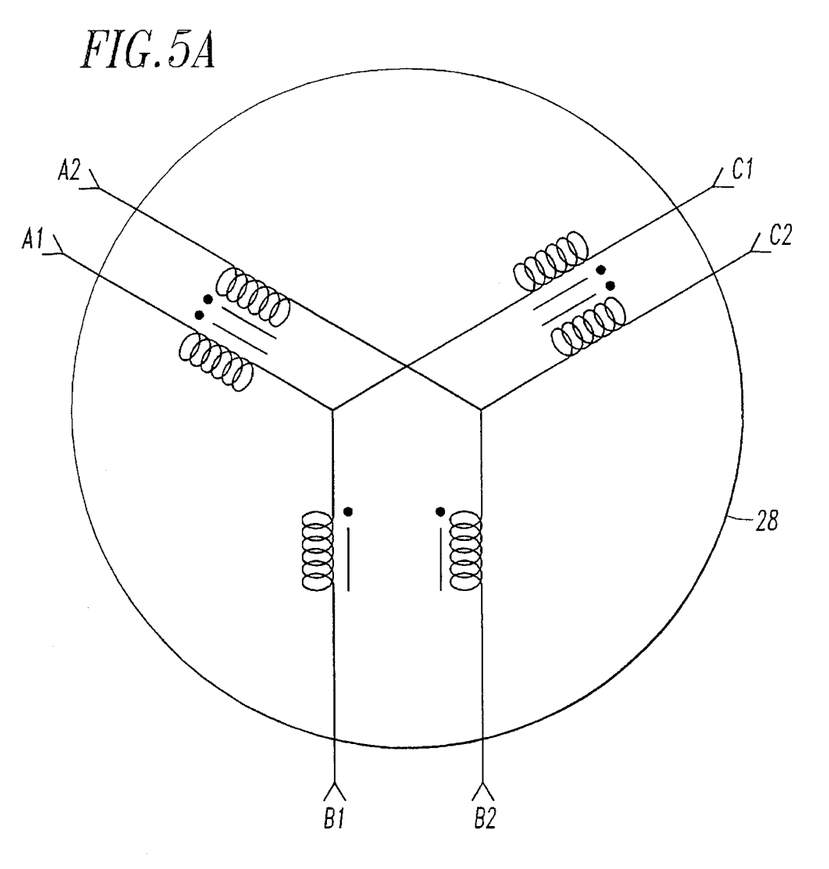
FIG. 5A is a schematic diagram of the motor of the electric vehicle propulsion system of FIG. 1.

As shown in FIG. 5A, the motor 28 is a 3-phase AC induction motor having two identical, electrically isolated, windings per phase (windings A1 and A2 are for the "A" phase, windings B1 and B2 are for the "B" phase, and windings C1 and C2 are for the "C" phase) for producing high torque at zero speed to provide performance comparable to conventional gas-driven engines. The rotor (not shown) of the motor 28 is coupled to the vehicle transaxle (not shown). Preferably, the two windings in each phase of the motor 28 are aligned substantially on top of one another and are electrically in phase such that each winding provides approximately half the total power of the phase. Also the motor 28 is preferably completely sealed and utilizes spray-oil cooling to remove heat directly from the rotor and end windings to increase reliability.

Figure 5B:
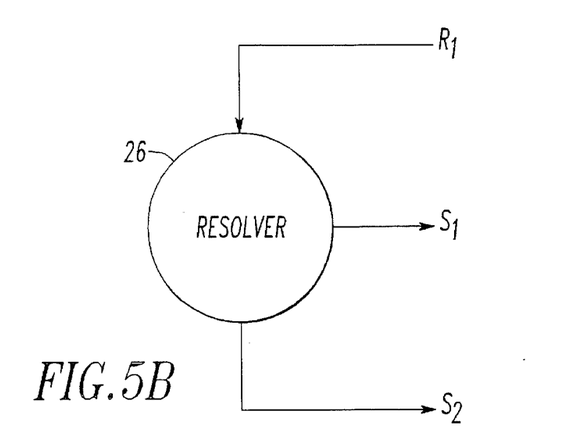
FIG. 5B is a schematic diagram of the resolver of the electric vehicle propulsion system of FIG. 1.

The resolver 26 is illustrated in FIG. 5B and is positioned proximate to the motor 28 for detecting the angular position of the motor shaft and for providing signals indicative of the angular position of the motor shaft to the motor controller 18. The reference signal line $R_1$ connected to the resolver is for a positive or negative reference value indicating the angular position of the motor shaft. The $S_1$ signal line from the resolver provides a positive or negative sine value for the angular position of the motor shaft and the $S_2$ signal line from the resolver provides a positive or negative cosine value for the angular position of the motor shaft.

The resolver 26 can comprise a commercially available resolver or other resolver known in the art. Reference signals for the resolver 26 are provided by the motor controller 18.

The chassis controller 22 and the motor controller 18 receive signals from a vehicle communication bus. Generally, the vehicle communication bus serves as a communication pathway for interfacing various vehicle sensors and controllers to the chassis controller 22 and the motor controller 18, as will be explained in more detail below.

The chassis controller 22 comprises a microprocessor-based digital and analog electronics system and provides control and status interfacing to the vehicle's sensors and controllers and to the motor controller 18. For example, the chassis controller 22 is connected, via the vehicle communication bus, to the vehicle key switch, accelerator, brake, and drive selector switches. The chassis controller 22 interprets signals from these switches to provide the motor controller 18 with start-up, drive mode (e.g., forward, reverse, and neutral), motor torque, regenerative braking, shutdown, and built-in test (BIT) commands. Preferably, the chassis controller 22 communicates with the motor controller 18 via an opto-coupled serial data interface and receives status signals from the motor controller 18 of all the commands sent to verify the communication links between the chassis controller 22, the vehicle, and the motor controller 18 and to verify that the vehicle is operating properly. It should be appreciated that because the chassis controller 22 provides the control and status interfacing to the vehicle's sensors and controllers and to the motor controller 18, the electric vehicle propulsion system 10 can be modified for use with any number of different vehicles simply by modifying the chassis controller 22 for a particular vehicle.

The chassis controller 22 also provides battery management capabilities by using signals received over the vehicle communication bus from a battery current sensor located in the power distribution module 20. The chassis controller 22 interprets signals from the battery current sensor, provides charging commands to the motor controller 18, and sends a state-of-charge value to a "fuel" gauge on the vehicle dashboard. The chassis controller 22 further connects, via the vehicle communication bus, to vehicle controllers including odometer, speedometer, lighting, diagnostic and emissions controllers, as well as to an RS-232 interface for system development. As shown in FIG. 4, the motor controller 18 includes a low voltage power supply 42, an input filter and DC relay control unit 44, a vector control board 46, and first and second power bridges and gate drives 48 and 50, respectively.

The low voltage power supply 42 converts the 12 volt output from the DC/DC converter 38 to provide +5 V, ±15 V, and +20 V outputs to the input filter and DC relay control unit 44, the vector control board 46, the first power bridge 48, and the second power bridge 50. The low voltage power supply 42 can comprise a commercially available power supply as is known in the art.

The input filter and DC relay control unit 44 includes electrical connections for coupling the 320 volt output of the power distribution module 20 to the first and second power bridges 48 and 50, respectively. The input filter and DC relay control unit 44 includes EMI filtering, a relay circuit for disconnecting the coupling of the 320 volt output of the power distribution module 20 to the first and second power bridges 48 and 50, respectively, and various BIT circuits including voltage sense circuits and a chassis ground fault circuit. Preferably, the input filter and DC relay control unit 44 receives control signals from and sends status signals, e.g., BIT signals, to the vector control board 46.

Each of the first and second power bridges 48 and 50, respectively, includes insulated gate bipolar transistor (IGBT) switching circuits and associated gate drive circuits for applying drive currents to each of the windings of the motor 28. Preferably, each of the first and second power bridges 48 and 50, respectively, provides half the current to the windings of the motor 28, thereby allowing the use of readily available, low cost IGBT switching circuits. The first and second power bridges 48 and 50, respectively, receive control signals from and send status signals, e.g., BIT signals, to the vector control board 46.

The vector control board 46 comprises a microprocessor based digital and analog electronics system. As its primary function, the vector control board 46 receives driver-initiated acceleration and braking requests from the chassis controller 22. The vector control board 46 then acquires rotor position measurements from the resolver 26 and current measurements from the first and second power bridges 48 and 50, respectively, and uses these measurements to generate pulse width modulated (PWM) voltage waveforms for driving the first and second power bridges 48 and 50, respectively, to produce the desired acceleration or braking effects in the motor 28. The PWM voltage waveforms are generated in accordance with a control program which is designed to result in a requested torque output. As described above, the vector control board 46 also has the function of controlling the input filter and DC relay control unit 44, the oil pump unit 34, the radiator/fan 36, the battery charger 16, the input filter and DC relay control unit 44, built in test circuitry, vehicle communication, and fault detection.

Figure 6:
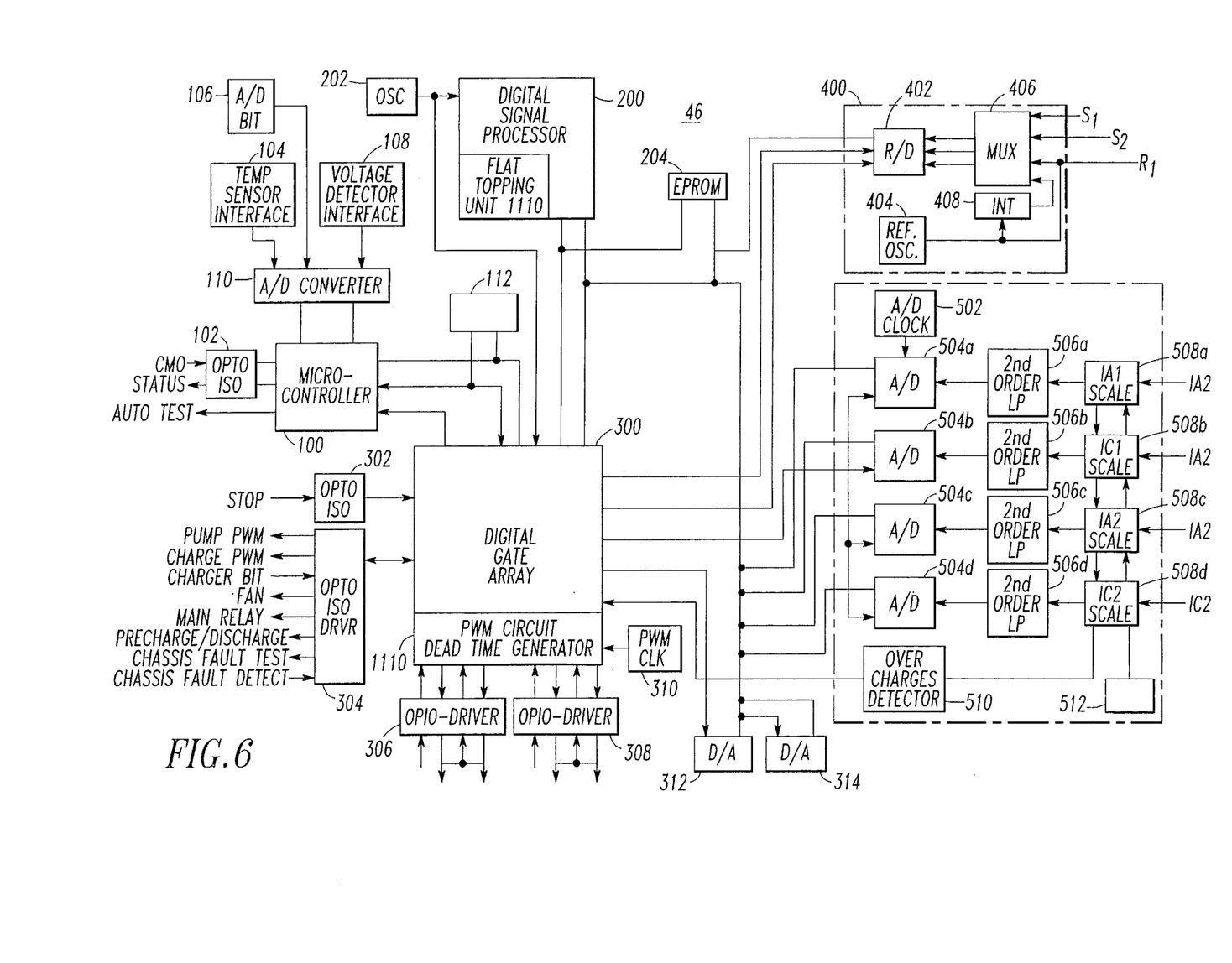
FIG. 6 is a schematic diagram of the vector control board of the motor controller of FIG. 4.

As shown in FIG. 6, the vector control board 46 comprises a microcontroller 100, a digital signal processor 200, a digital gate array 300, a resolver interface 400, and an analog interface 500. Clock signals for the microcontroller 100, the digital signal processor 200, and the digital gate array 300 are provided by an oscillator 202.

Referring to FIG. 6, the microcontroller 100 comprises, for example, a microcontroller selected from the Motorolla 68HC11 family of microcontrollers or other similar device known in the art. As its main function, the microcontroller 100 performs various housekeeping functions of the vector control board 46. For example, the microcontroller 100 communicates with the chassis controller 22 by receiving current commands, BIT commands, torque commands, and mode commands from and sending status signals to the chassis controller 22 via an opto-isolator 102. The microcontroller 100 also communicates with the digital signal processor 200 by providing the digital signal processor 200 with torque requests via the digital gate array 300, and communicates with the digital gate array 300 to perform, for example, various BIT and control operations. Preferably, the microcontroller 100 includes a combination of RAM, ROM, and EEPROM for storing program instructions for controlling its operation. Alternatively, some or all of the program instructions can be stored in an EPROM 112.

The microcontroller 100 also receives analog input signals from a temperature sensor interface 104, an A/D BIT circuit 106, and a voltage detector interface 108 via an A/D converter 110. The A/D converter 110 is preferably part of the microcontroller 100.

The analog input signals from the temperature sensor interface 104 include temperature signals transmitted by temperature sensors (not shown) located on the cold plate 14 in proximity to the first and second power bridges 48 and 50, respectively. The analog input signals from the A/D BIT circuit 106 include voltage test signals for testing the A/D converter 110. The analog input signals from the voltage detector interface 108 include voltage signals transmitted by voltage detectors (not shown) located in the input filter and DC relay control unit 44.

The digital signal processor 200 comprises, for example, a Texas Instrument TMS320C50 digital signal processor or other similar device known in the art. As its main function, the digital signal processor 200 implements a torque control program stored in an EPROM 204 and down loaded to RAM located in the digital signal processor 200 upon start up of the electric vehicle propulsion system 10. Alternatively, the digital signal processor 200 may be preprogrammed to include the torque control program.

In particular, the digital signal processor 200 receives the digitized rotor position measurements from the resolver interface 400, the digitized current measurements from the analog interface 500, and torque commands from the microcontroller 100 and uses these measurements and commands to generate phase voltage signals. As will be explained in more detail below, these phase voltage signals are supplied to the digital gate array 300, whereby the digital gate array 300 produces pulse width modulated (PWM) voltage waveforms in the form of gate drive signals to produce desired acceleration or braking effects in the motor 28. The phase voltage signals, and thus the PWM voltage waveforms, are generated in accordance with the torque control program which is designed to result in a requested torque output.

The digital gate array 300 comprises, for example, a field programmable gate array or other similar device known in the art. The digital gate array 300 generates and receives via an opto-isolator driver 304 various PWM signals for controlling the oil pump unit 34 and the battery charger 16 as well as various control signals for controlling the radiator/fan 36, main and precharge/discharge relays (not shown) located in the input filter and DC relay control unit 44, and a chassis fault detection unit also located in the input filter and DC relay control unit 44. Also, the digital gate array 300 receives operator initiated emergency stop signals via the opto-isolator driver 304.

The digital gate array 300 receives the phase voltage signals Va, Vb, and Vc from the digital signal processor 200. The phase voltage signals are applied to a digital pulse width modulator with integrated test and control to produce PWM voltage waveforms in the form of gate drive signals for driving the first and second power bridges 48 and 50, respectively.

Figure 7:
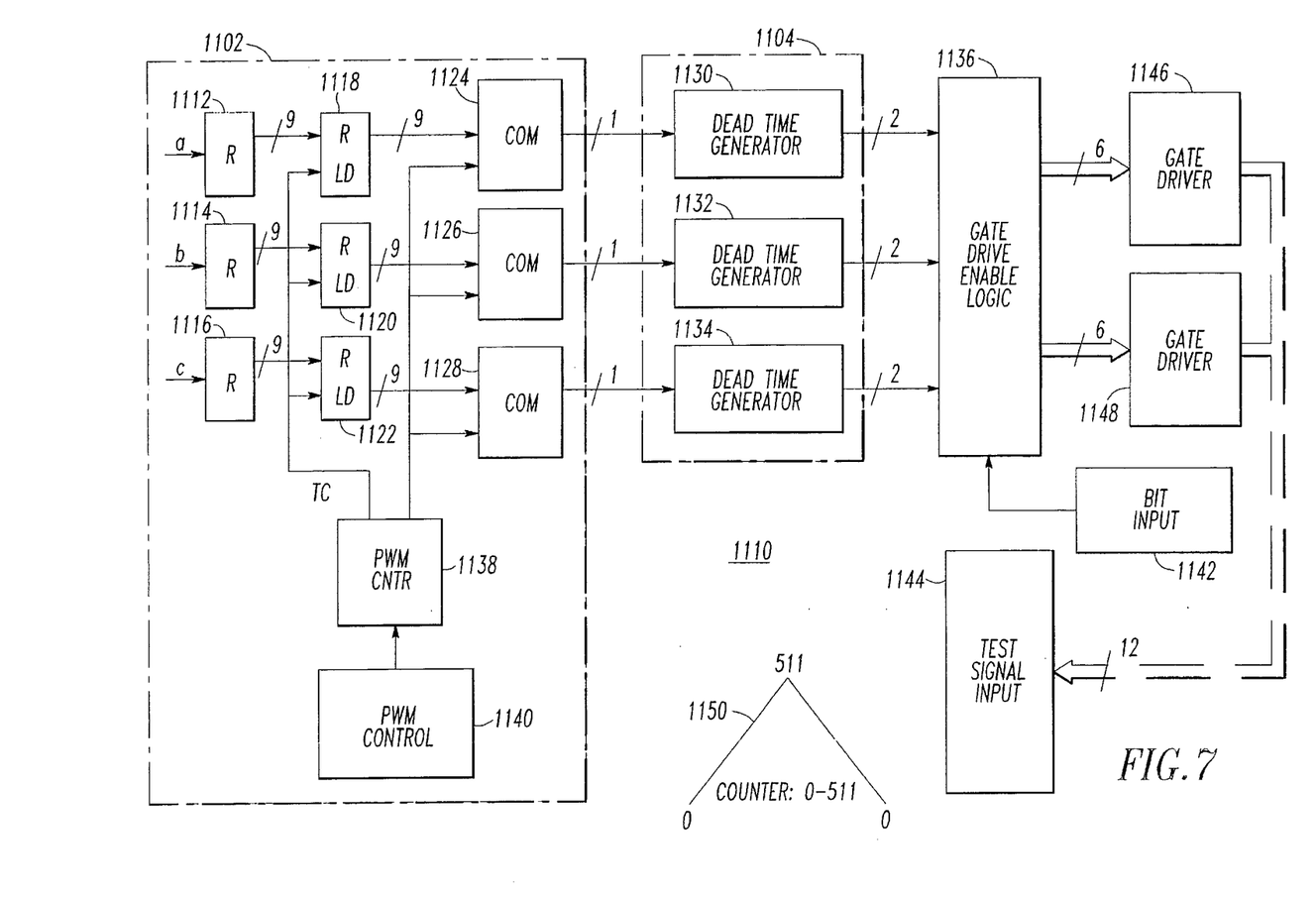
FIG. 7 is a block diagram of the digital pulse width modulator circuit in accordance with the present invention.

An exemplary embodiment of the digital pulse width modulator with integrated test and control of the present invention is shown in FIG. 7, and is designated generally by the reference numeral 1110. The digital pulse width modulator circuit 1110 is included in the digital gate array 300 (FIG. 6).

As shown in FIG. 7, the digital pulse width modulator of the present invention comprises digital PWM 1102 including input registers 1112, 1114 and 1116, a second set of registers 1118, 1120 and 1122, comparators 1124, 1126 and 1128, PWM counter 1138, and PWM control 1140; dead time generator unit 1104 including dead time generators 1130, 1132 and 1134; gate drive enable logic 1136; BIT testability input 1142; and test signal input 1144. FIG. 7 also shows gate drivers 1146 and 1148, which receives the PWM waveforms, and a digitized triangular waveform 1150, which is output from the PWM counter 1138, that counts from 0 to 511 and then back to 0.

The pulse width modulator of the present invention includes an input section for receiving an N-bit digitized input signal to be modulated.

Referring to FIG. 7, the voltage reference signals Va, Vb and Vc are applied to a first set of input registers 1112, 1114 and 1116. The voltage reference signals are preferably N=9 bit digital signals. The voltage reference signals from the first set of the input registers are loaded into a second set of input registers 1118, 1120, and 1122 synchronously with a terminal count from a PWM counter 1138, as shown in FIG. 7. Both sets of the input registers are preferably 9 bit registers.

The pulse width modulator circuit of the present invention includes a PWM counter for continuously counting up from zero to a predetermined number and back down to zero. The PWM counter generates a digitized triangle waveform having N-bits of resolution corresponding to the predetermined number.

Referring to FIG. 7, a PWM counter 1138 outputs a terminal counter (TC) to synchronously load the digital voltage reference signals into registers 1118, 1120 and 1122 under control of a PWM control 1140. The PWM counter 1138 continuously counts a number from 0 to 511 (9 bit resolution) and back down to 0 to produce a digital triangle waveform (this is shown as label 1150).

The pulse width modulator of the present invention includes a compare unit for receiving and comparing the digitized input signal with the digitized triangular waveform to produce a PWM output pulse.

Referring to FIG. 7, the compare unit includes comparators 1124, 1126 and 1128. The comparators 1124, 1126 and 1128 respectively compare the digitized voltage reference signals from registers 1118, 1120 and 1122 with the digitized triangular waveform 1150 from the PWM counter 1138. If we consider the comparator 1124 and the first voltage reference signal Va, the comparator 1124 compares the loaded voltage reference signal Va from the input register 1118 with each successive count from 1 to 510 (or from 510 to 1) from the PWM counter 1138. For example, the comparator 1124 compares the loaded reference signal Va to the PWM count starting with 1, 2, 3, 4, etc. to 510 (or 510, 509, 508, etc. to 1). When the loaded reference signal is greater than the PWM count, then the output PWM pulse is at a logic low state, for example. When the loaded reference signal is less than or equal to the PWM count, for example, then the output PWM pulse is at a logic high state.

The input registers can be loaded prior to the count up or count down of the 9 bit counter for comparison and generation of the pulse width. The voltage reference signals may be loaded in one of two methods. In the first method, the voltage reference signals are loaded for each count from 0 to 511 or from 511 to 0. In other words, if a count from 0 to 511 and back down to 0 is considered to be one period of the triangular waveform, then the voltage references signals are loaded once for each half period (or twice for the full one period). In the second method, the voltage reference signals are loaded once for the full one period. The first method will have less harmonic distortion and smoother motor control while the second method will allow for more processing time between the pulse width updates.

The comparators, however, do not compare the loaded voltage reference signals with the valley count 0 (9 bits of all zeros) or the peak count 511 (9 bits of all ones), thereby preventing over modulation. Over modulation occurs when the input register value (the loaded reference signal) is the same as the counter value corresponding to the peak and valley of the triangular waveform. The pulse width modulator circuit modifies the input signal value by one count to prevent the peak (511) and valley (0) counts from being compared with the triangular waveform. This design of the PWM circuit relieves a controller such as a processor that must otherwise spend time to check each input value as it is generated.

The PWM counter is controlled by the PWM controller 1140. The PWM controller 1140 provides synchronization pulses (TC) at the peaks (511) and valleys (0) of the count, for example, to the input register 118, 1120 and 1122 to load the next signal (depending on the method used as discussed above), to the analog-to-digital (A/D) converters (504a, 504b, 504c and 504d) for sampling the current in the motor 28 through the analog interface 500 (FIG. 6) of the vector control board 46 (FIG. 4) of the motor controller 18 (FIG. 1), and to the digital signal processor (DSP) 200 of the vector control board 46 (FIG. 6). The DSP 200 receives the sampled current synchronously with the synchronization pulse from the PWM control 1140 and initiates an algorithm to provide a correct torque corresponding to the request from the operator of the vehicle through microcontroller 100. Accordingly, the PWM control 1140 synchronized various devices in the vector control board using the peaks and/or valleys of the PWM counter 1138. The peaks (511) and valleys (0) of the count are used for synchronization because, for example, at counts 0 and 511, the switching transients in the motor controller 18 will not corrupt the analog-to-digital samples in the analog interface 500.

Accordingly, the PWM control 1140 of the PWM circuit is designed to force the generation of pulses, which are used to initiate analog-to-digital sampling, to be synchronous with the peak and/or valley of the triangular waveform. Accordingly, counts 0 and 511 are not compared to the voltage reference signals Va, Vb and Vc.

The pulse width modulator circuit includes a dead-time generator unit 1104 for producing a first pulse and a second pulse from the output pulse generated from the compare unit. Each of the first and second pulses drives a corresponding one of the switching circuits and the first and second pulses have different transition times relative to each other. The first pulse has a first delay and the second pulse has a second delay, which are synchronous with the output pulse from the compare unit.

Referring to FIG. 7, a dead-time generator unit 1104 includes dead-time generators 1130, 1132 and 1134, each receiving a corresponding PWM output pulse from the comparators 1124, 1126 and 1128. The dead-time generator unit 1104 produces an upper pulse and lower pulse from each of the corresponding PWM output pulses. The upper pulse corresponds to a gate driver for driving one of a pair of switching devices including insulated gate bipolar transistors (IGBTs). The lower pulse corresponds to a gate driver for driving the other one of the pair of switching devices. For example, consider a pair of switching devices that deliver high power to the motor 28 (FIG. 5A). In this scenario, an upper and lower pulse pair drive the IGBT pairs that connect and correspond to each of the terminals, A1, A2, B1, B2, C1 and C2 of the motor 28. Accordingly, each terminal has two switching devices from which the power is delivered. A dead-time delay is needed between the upper and lower pulses because if no delay is introduced, both switching devices of a terminal may activate (close) to create a short circuit. Accordingly, a proper delay should be introduced in the upper and lower pulses in synchronous with the PWM output pulse. The start of the delay is always synchronous with the occurrence of the comparator output transitions and this synchronous delay allows the PWM signal to retain the 9-bit resolution.

Figure 8:
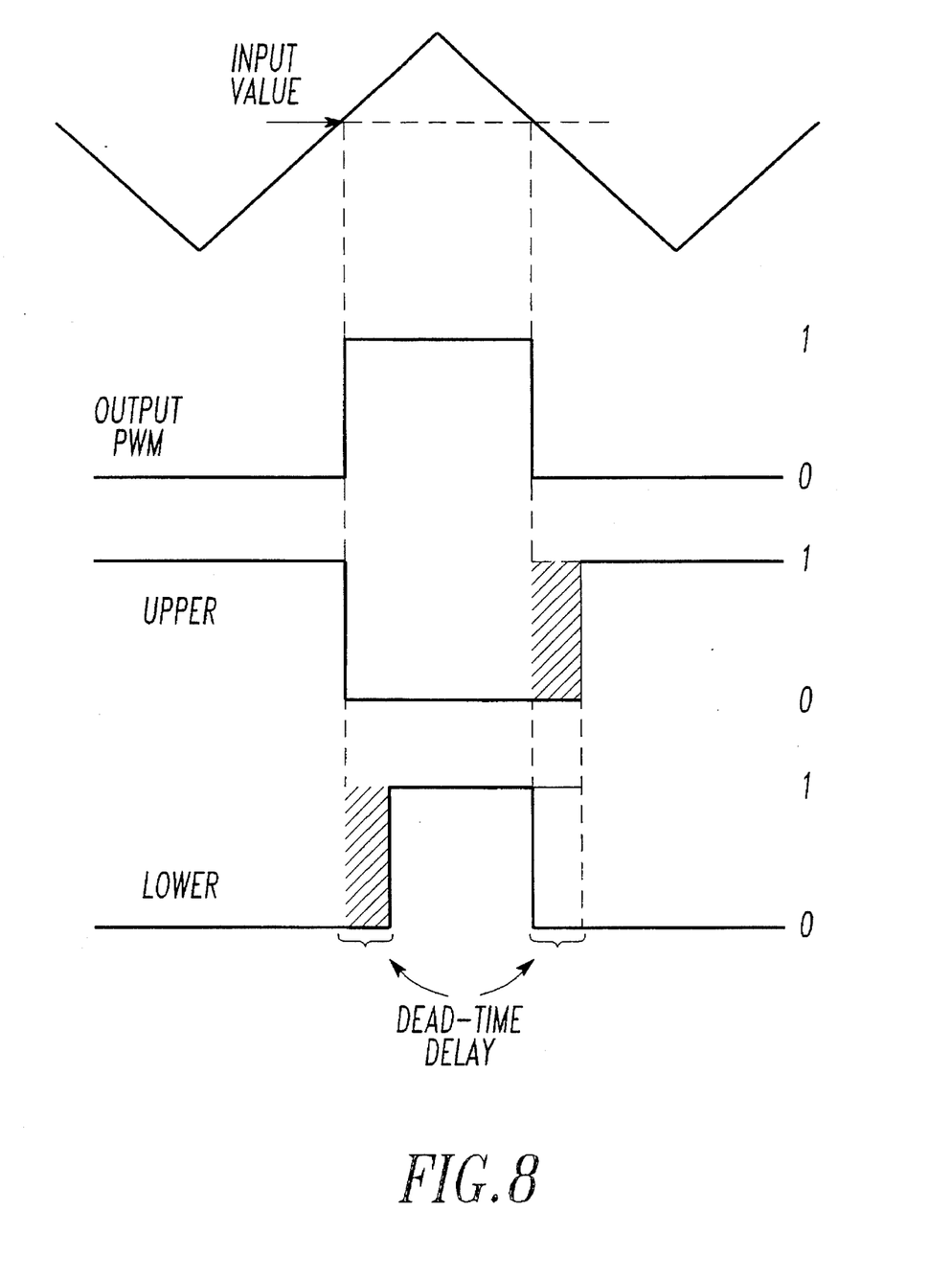
FIG. 8 illustrates a dead-time waveform generated from the digital pulse width modulator in FIG. 7.

The dead-time delay is generated by the dead-time generator unit 1104 and is explained with reference to FIG. 8 as follows. When the output PWM pulse is generated from the compare unit, the dead-time generator unit 1104 produces an upper pulse and a lower pulse, as shown in FIG. 8. To allow enough time for each corresponding switch to open and close, a dead-time delay is introduced. For example, when the upper pulse transitions from a logic 1 to a logic 0 to open its corresponding switch, the lower pulse must wait for a duration long enough for the opening of the switch before transitioning from a logic 0 to a logic 1 to close its corresponding switch. At this state, when the upper pulse needs to transition from a logic 0 to a logic 1 to close its corresponding switch, the upper pulse must wait for a duration long enough for the lower pulse to transition from a logic 1 to a logic 0 to open its corresponding switch before the upper pulse can transition to the logic 1 and close its switch. Introduction of a delay is necessary to ensure that one switch is open before the other switch closes. The dead-time generator unit 1104 provides such assurance, as shown in FIG. 8.

Also, the digital PWM 1102 preferably operates at a frequency of approximately 8 kHz and the dead-time generator unit 1104 generates a delay of approximately 3 microseconds.

The pulse width modulator circuit of the present invention further includes a logic circuit for receiving the first (upper) and second (lower) pulses and enabling the driver control unit in accordance with he first and second pulses, respectively.

Figure 9:
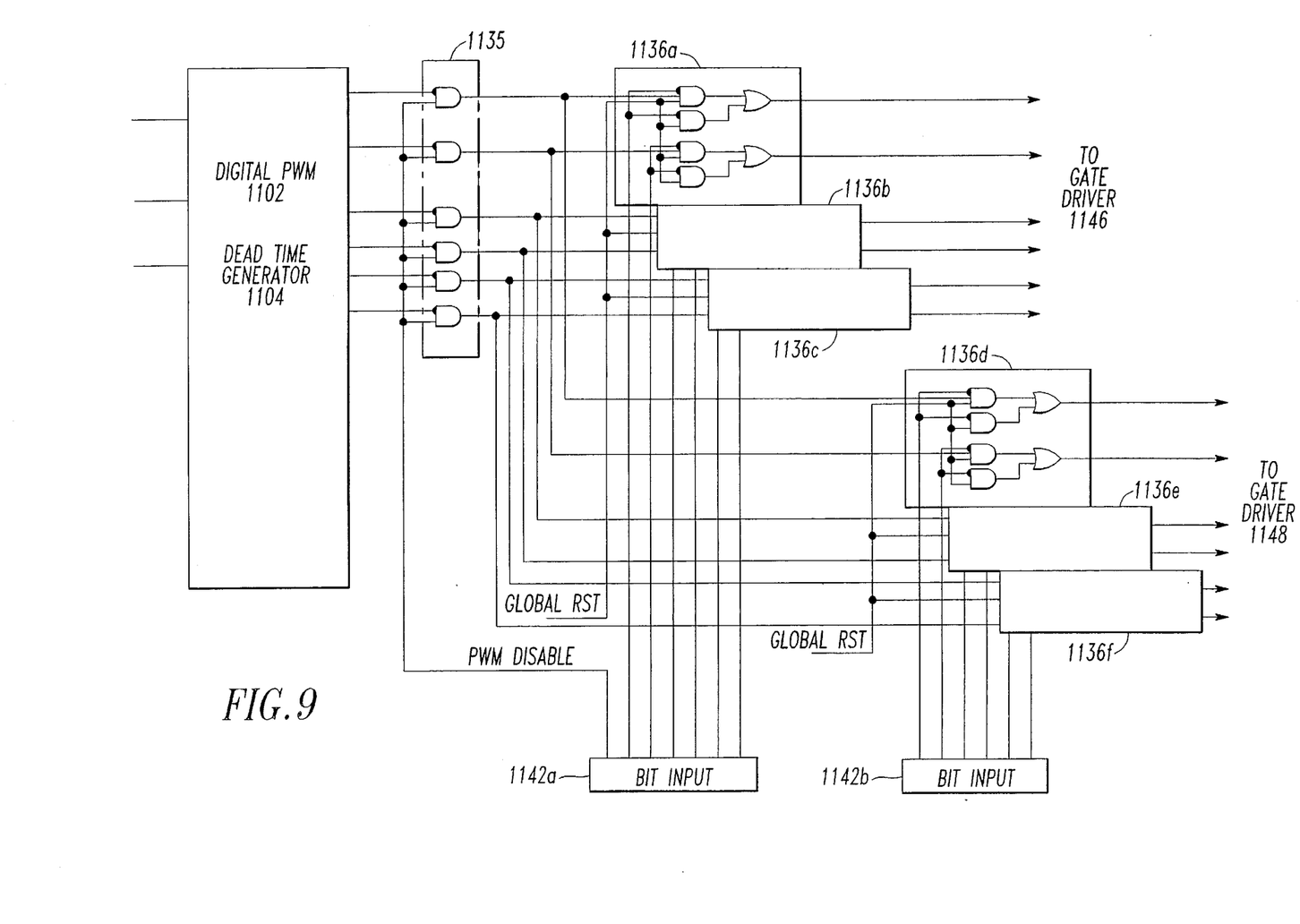
FIG. 9 is a detail circuit diagram of the digital pulse width modulator circuit in FIG. 7.

Referring to FIGS. 7 and 9, the dead-time generators 1130, 1132 and 1134 sends the upper and lower pulses of each of the voltage reference signals Va, Vb and Vc to the gate drive enable logic circuit 1136 including disable logic circuit 1135 and combinatorial logic circuits 1136a, 1136b, 1136c, 1136d, 1136e, 1136f. The gate drive enable logic circuit 1136 is preferably a combinatorial logic circuit which generates correct gate drive signals for the upper and lower pulses corresponding to respective voltage reference signals. In particular, the logic circuit 1136 provides a duplicate gate drive signals for the same upper and lower pulses. The former gate drive signals corresponds to the first set of the windings (A1, B1 and C1) of the motor 28 (FIG. 5A) while the latter gate drive signals (duplicate) corresponds to the second set of the windings (A2, B2 and C2) of the motor 28, where A1 and A2 windings are for phase A, B1 and B2 windings are for phase B, and C1 and C2 windings are for phase C. Thus, six lines (corresponding to A1 upper and lower, B1 upper and lower, and C1 upper and lower) are output from the gate drive enable logic circuit 1136 to gate driver 1146 and another six lines (corresponding to A2 upper and lower, B2 upper and lower, and C2 upper and lower) are output to gate driver 1148.

The pulse width modulator circuit of the present invention includes a built-in test (BIT) circuit for providing BIT input signals corresponding to the first (upper) and second (lower) pulses to verify correct operation of the PWM circuit including a feed back path from the driver control unit, the driver control unit having a higher level of integration than the PWM circuit. The BIT input signals provide individual control of each of the PWM signals.

Referring to FIG. 7, the built-in test circuit includes the gate drive enable logic 1136, the test signal input 1144 and the BIT input 1142. The BIT circuit verifies the correct operation of higher level of integration, e.g., the motor controller 18. For example, referring to FIG. 8, the microcontroller 100 (FIG. 6) can control the state of each of the outputs by writing to the BIT input 1142 and disabling the PWM output pulses from the dead-time generator. This is shown in more detail in FIG. 9.

Referring to FIG. 9, the BIT input 1142 is separated into two sets, BIT input 1142a and 1142b. BIT inputs 1142a and 1142b respectively correspond to the two identical, electrically isolated, windings per phase (windings A1 and A2 are for the "A" phase, windings B1 and B2 are for the "B" phase, and windings C1 and C2 are for the "C" phase), explained with reference to FIG. 5A above. BIT input 1142a includes bit test inputs for A1U, A1L, B1U, B1L, C1U, C1L ("U" corresponds to the upper pulse from the dead-time generator unit and "L" corresponds to the lower pulse from the dead-time generator unit). Similarly, BIT input 1142b includes bit test inputs for A2U, A2L, B2U, B2L, C2U, C2L. BIT inputs 1142a and 1142b includes a power reset input (POWER RST) which is used for resetting purposes during system power reset. BIT input 1142a also includes PWM disable input which disables the signal from the dead-time generator unit 1104 through an enable/disable unit 1135 (which is a part of the gate drive enable logic 1136) during the BIT input test. Accordingly, signals VA1U, VA1L, VB1U, VB1L, VC1U and VC1L are disabled and the test input signals from the BIT inputs 1142a and 1142b are applied to the combinatorial logic circuits 1136a, 1136b, 1136c, 1136d, 1136e and 1136f. The combinatorial logic circuits can be reset altogether using the GLOBAL RESET signal from the microcontroller 100.

In addition to testing the correct operation of higher level integration, the entire PWM circuit including the digital PWM 1102, dead-time generator unit 1104 and gate drive enable logic 1136 can be tested over all nine bits of pulse width resolution. For example, referring to FIGS. 7 and 9, the digital signal processor 200 provides test input signals TVa, TVb and TVc in place of the voltage reference signals Va, Vb and Vc. The test input signals include each step of the nine bits (0 to 511). The PWM circuit performs the same operations—as discussed with reference to the voltage reference signals Va, Vb and Vc—with the test input signals to produce upper and lower pulses from the dead-time generator unit 1104. The upper and lower pulses corresponding to the test input signals are applied to the gate drive enable logic 1136 and subsequently to the gate drivers 1146 and 1148 (the BIT input 1142 does not play a part in this test sequence). The gate drivers 1146 and 1148 feed back the corresponding drive signals to the test signal input 1144. The drive signals are compared to known values corresponding to the particular test input signal. Accordingly, each step of the nine bit test input signal from 0 to 511 can be tested.

The independent PWM circuit 1102, BIT circuit including BIT input 1142 and test signal input 1144 and control circuit are packaged in one digital logic array 300 that interfaces with the digital signal processor 200 and microcontroller 100 (see FIG. 6).

The delay generated from the dead-time generator unit 1104 is synchronous with the PWM output pulse. The periodic digital triangular waveform is programmable, over modulation is prevented, and synchronous sampling signals are developed and programmably adjusted.

The present invention identifies several features for generating pulse width modulation including (1) all digital implementation to support interfacing circuitry such as a DSP 200, microcontroller 100 and other digital components to overcome shortcomings in analog components, (2) three high resolution, 9 bit, PWM functions implement control in a three phase motor controller, which reduces current ripple allowing smoother torque control and better efficiency, (3) a synchronous dead-time generator maintains 9 bits of resolution in a 9 bit system, (4) built-in test verifies the functionality of the PWM design and the functionality at the next higher level of integration, with individual control of each of the PWM signals and a feed back path to verify signal levels, (6) generation of sampling pulses that are synchronous with the peaks and valleys of the triangular waveform and programmable selection between synchronization with the peaks or both peaks and valleys, which allows the pulse width to be controlled at the PWM frequency or twice the frequency, and (7) over modulation is prevented.

The circuitry in the dead-time generator unit 1104 implements the synchronous dead-time delay between the signals that are used to control the switching devices in the controller power output stage. Two PWM signals (upper and lower) are generated from the dead-time circuit (FIG. 8) and a delay is generated between the lower and upper signals. The start of the delay is always synchronous with the occurrence of the comparator output transitions. This synchronous delay allows the PWM signal to retain a full N(=9)-bit resolution.

The built-in test circuitry allows the state of each of the outputs to be controlled by writing to test registers. This is used to independently test portions of the next higher assembly of the controller. The test inputs are used by feeding back the PWM gate drive signals to verify that the digital circuitry is producing the correct pulse width for a known input register value. Each bit of resolution can be tested by specifying the appropriate input value.

It will be apparent to those skilled in the art that various modifications and variations can be made in the digital pulse width modulator with integrated test and control of the present invention without departing from the spirit or scope of the invention. Thus, it is intended that the present invention cover the modifications and variations of this invention provided they come within the scope of the appended claims and their equivalents.

We claim:

1. A pulse width modulator (PWM) circuit for generating pulses to enable a driver control unit to drive a pair of switching circuits for an electric motor comprising:

an input section for receiving an N bit digitized input signal to be modulated;

a PWM counter for continuously counting up from zero to a predetermined number and back down to zero, the PWM counter generating a digitized triangular waveform having N bits of resolution corresponding to the predetermined number;

a compare unit for receiving and comparing the digitized input signal and the digitized triangular waveform to provide an output pulse;

a dead-time generator unit for producing a first pulse and a second pulse from the output pulse produced from the compare unit;

a logic circuit for receiving the first and second pulses and enabling the driver control unit in accordance with the first and second pulses, the first and second pulses each driving a corresponding one of the switching circuits, the first and second pulses having different transition times relative to each other; and a built-in test (BIT) circuit for providing BIT input signals corresponding to the first and second pulses to verify correct operation of the PWM circuit including a feed back path from the driver control unit, the driver control unit having a higher level of integration than the PWM circuit, and the BIT input signals providing control of said PWM circuit.

2. The pulse width modulator (PWM) circuit according to claim 1, wherein the first pulse has a first delay and the second pulse has a second delay, the first and second delays being synchronous with the output pulse from the compare unit.

3. The pulse width modulator (PWM) circuit according to claim 1, further comprising a pulse width modulator control for controlling the PWM counter, the pulse width modulator control providing synchronization signals for synchronizing operation of the PWM circuit to peaks and valleys of the digitized triangular waveform.

4. The pulse width modulator (PWM) circuit according to claim 3, wherein the pulse width modulator control provides the synchronization signals to the input section for loading the digitized input signal synchronously with the PWM counter.

5. The pulse width modulator (PWM) circuit according to claim 6, wherein the PWM circuit including the dead-time generator unit and the BIT circuit is implemented as a stand-alone, single chip, digital logic array.

6. The pulse width modulator (PWM) circuit according to claim 1, wherein the digitized triangular waveform is implemented as a 9 bit counter continuously counting from 0 to 511 and from 511 to 0, where a count from 0 to 511 to 0 or a count from 511 to 0 to 511 represents one period.

7. The pulse width modulator (PWM) circuit according to claim 6, wherein the output pulse is generated with an input register loaded once during an up-count from 0 to 511 of the period and once during a down-count from 511 to 0 of the period.

8. The pulse width modulator (PWM) circuit according to claim 1, wherein the input section includes registers for loading the digitized input signal synchronously with the PWM counter, and the compare unit compares a N bit digital value of the input signal to the digitized triangular waveform from the N bit PWM counter and produces the output pulse.

9. The pulse width modulator (PWM) circuit according to claim 8, wherein the output pulse is generated with the input register loaded only once during one period of the triangular waveform.

10. The pulse width modulator (PWM) circuit according to claim 8, wherein the output pulse is at a logic low state at times when the PWM counter is less than the digital input signal and the output pulse is at a logic high state at time when the PWM counter is greater than the digital input signal.

11. The pulse width modulator (PWM) circuit according to claim 8, wherein the output pulse is at a logic high state at times when the PWM counter is less than the digital input signal and the output pulse is at a logic low state at time when the PWM counter is greater than the digital input signal.

12. The pulse width modulator (PWM) circuit according to claim 8, wherein the input registers are loaded prior to both up-count and down-count of a 9 bit counter.

13. A pulse width modulator (PWM) circuit for generating pulses to enable a driver control unit to drive a pair of switching circuits for an electric motor comprising:

a input section for receiving an N bit digitized input signal to be modulated;

a PWM counter for continuously counting up from zero to a predetermined number and back down to zero, the PWM counter generating a digitized triangular waveform having N bits of resolution corresponding to the predetermined number;

a compare unit for receiving and comparing the digitized input signal and the digitized triangular waveform to provide an output pulse;

a dead-time generator unit for producing a first pulse and a second pulse from the output pulse produced from the compare unit, the first and second pulses each driving a corresponding one of the switching circuits, the first and second pulses having different transition times relative to each other; and means for preventing input signal values corresponding to peak and valley of the triangular waveform from being compared to the triangular waveform.

14. A pulse width modulator (PWM) circuit for generating pulses to enable a driver control unit to drive a pair of switching circuits for an electric motor comprising:

an input section for receiving an N bit digitized input signal to be modulated;

a PWM counter for continuously counting up from zero to a predetermined number and back down to zero, the PWM counter generating a digitized triangular waveform having N bits of resolution corresponding to the predetermined number;

a compare unit for receiving and comparing the digitized input signal and the digitized triangular waveform to provide an output pulse;

a dead-time generator unit for producing a first pulse and a second pulse from the output pulse produced from the compare unit, the first and second pulses each driving a corresponding one of the switching circuits, the first and second pulses having different transition times relative to each other;

a logic circuit for receiving the first and second pulses and enabling the driver control unit in accordance with the first and second pulses, respectively; and a test control unit for replacing the input signal of the PWM circuit with a test signal to test the PWM circuit, the test control unit comparing actual PWM output pulses generated from the PWM circuit corresponding to the test signal with known output pulses corresponding to the test signal.

15. The pulse width modulator (PWM) circuit according to claim 14, wherein the test signal includes all digital values from zero to the predetermined number.

* * * * *